United States Patent [19]
Uhling et al.

[11] Patent Number: 5,940,965
[45] Date of Patent: Aug. 24, 1999

[54] METHOD OF MAKING MULTIPLE LEAD VOLTAGE PROBE

[75] Inventors: Thomas F. Uhling, Vancouver, Wash.; David J. Dascher; Keith C. Griggs, both of Colorado Springs, Colo.

[73] Assignee: Hewlett-Packard Company, Palo Alto, Calif.

[21] Appl. No.: 08/846,983

[22] Filed: Apr. 30, 1997

Related U.S. Application Data

[60] Division of application No. 08/518,408, Aug. 23, 1995, Pat. No. 5,654,647, which is a continuation-in-part of application No. 08/384,296, Feb. 3, 1995, Pat. No. 5,625,299.

[51] Int. Cl.⁶ .................................................. H01R 9/00
[52] U.S. Cl. ............................ 29/842; 29/593; 324/754
[58] Field of Search ............................ 29/593, 843, 832; 324/754

[56] References Cited

U.S. PATENT DOCUMENTS

| | | | |
|---|---|---|---|
| 3,984,166 | 10/1976 | Hutchinson . | |
| 4,568,798 | 2/1986 | Ambros et al. . | |
| 4,630,355 | 12/1986 | Johnson | 29/593 X |
| 4,891,585 | 1/1990 | Janko et al. | 324/158 P |
| 5,008,614 | 4/1991 | Shreeve et al. | 29/593 X |
| 5,015,946 | 5/1991 | Janko . | |
| 5,132,613 | 7/1992 | Papae et al. | 324/158 F |
| 5,205,741 | 4/1993 | Steen et al. | 439/70 |
| 5,244,395 | 9/1993 | DeSantis et al. | 439/65 |
| 5,266,059 | 11/1993 | Taylor | 439/912 |
| 5,288,238 | 2/1994 | Ikenaka et al. | 439/91 |
| 5,323,107 | 6/1994 | D'Souza . | |
| 5,389,885 | 2/1995 | Swart . | |
| 5,583,447 | 12/1996 | Dascher . | |
| 5,629,617 | 5/1997 | Uhling et al. . | |

FOREIGN PATENT DOCUMENTS 4-6846 1/1992 Japan .

*Primary Examiner*—Carl J. Arbes

[57] ABSTRACT

A probe head includes analog amplifier inputs, a ground plane, and hundreds of probe leads between the inputs and the pins of a circuit under test. The customer defines the grounded pins of the circuit under test. Non-active probe leads, i.e. leads corresponding to the grounded pins are connected to the ground plane, maximizing the connections between the grounds of the probe and the circuit under test and minimizing unequal ground potentials. The probe circuit is on a probe circuit board, while the connections between the ground plane and the leads are fusible elements on a separate ground personality board. The probe is placed on a simulated circuit under test, the grounded pins on the circuit under test are protected by an insulating cap, and a voltage is placed on the remainder of the pins to fuse the elements corresponding the active probe leads.

4 Claims, 10 Drawing Sheets

METHOD OF MAKING MULTIPLE LEAD VOLTAGE PROBE

CROSS REFERENCE TO RELATED APPLICATION(S)

This is a divisional of application Ser. No. 08/518,408 filed on Aug. 23, 1995 now U.S. Pat. No. 5,654,647, which is a continuation-in-part of U.S. patent application Ser. No. 08/384,296 now U.S. Pat. No. 5,625,299, filed Feb. 3, 1995.

BACKGROUND OF THE INVENTION

1. Field of the Invention

The invention in general relates to voltage probes for passing a test signal from an electronic circuit element to be tested to an oscilloscope or other electronic measurement device, and more particularly to such a probe that has multiple leads densely packed into a small area, certain of which leads are grounded. The invention also relates to a method of making such a probe with grounded leads.

2. Description of the Related Art

Voltage probes are commonly used to pass analog test signals from a circuit under test to an oscilloscope or other electrical or electronic test instrument. Such an electronic probe must be capable of passing an electrical signal on a node or pin of the circuit under test to the test instrument without distorting it, i.e. with high signal integrity. Further, it should not apply any voltage or current to the circuit under test. Present-day electronic circuits operate over frequencies from DC to several gigahertz. Thus, test probes capable of being used with a wide variety of circuits must be able to provide high signal integrity over a wide band width of frequencies.

Integrated and hybrid circuits are becoming both more complex and smaller, leading to ever higher numbers of package leads crowded into less and less space, that is, the leads are becoming extremely dense with very tight pitches. The parent application referred to above has essentially the same high density of circuitry as state-of-the-art integrated and hybrid circuits. The closeness of the individual leads in such high density circuits generally results in coupling between the leads and associated noise, distortion, etc. which is unacceptable in voltage probes. Thus, a probe that has a high density of leads yet in which the noise and coupling is virtually eliminated.

As will become evident below, the present invention solves the above problem in part by grounding all the leads of the probe that are connected to the pins of the circuit under test that are grounded. This usually results in a large number of grounded leads. Since the leads that are grounded are determined by the application of the probe, that is the particular chip to which a probe is applied, this also results in a probe that is, in part, custom manufactured for its end application. It would be highly desirable to have a simple yet effective method of manufacturing probes with such customized grounded leads.

Voltage probes are sophisticated electronic instruments and thus are not inexpensive. Thus, it would also be highly desirable to have a voltage probe, the leads of which could be customizably grounded for its specific application, and, at the same time, could be still be used in many applications with little additional expense.

SUMMARY OF THE INVENTION

The present invention solves the problem of noise and coupling between closely packed leads by providing a probe designed so that its ground and the ground of the circuit under test will be essentially at the same ground potential. This is done by maximizing the number of probe leads that are connected both to the probe ground and the ground of the circuit to be tested. This is facilitated by allowing the user of the probe to define the pins on the circuit to be tested which are to be grounds, and then designing the probe so that all probe leads that correspond to grounded pins on the circuit under test are connected to the probe ground. This all but eliminates noise and coupling.

The invention solves the problem of having a probe that is customizable and yet can be used in many applications with little expense by providing a voltage probe with a ground personality board. The ground personality board includes a circuit that connects selected leads to ground. By simply replacing the ground personality board, the probe can be used in many different applications.

The invention also provides a method of easily customizing the leads that are connected to ground. In the method, a board in which each lead is connected to ground through a fuse is installed in the probe. Then a voltage that is high enough to destroy the fuse, yet low enough so as not to harm any portion of the probe circuit, is applied to each lead that is selected to be an active lead. This voltage blows the fuse to ground for that lead. The board thus becomes a ground personality board in which only the leads that are selected to be grounds for the specific application are grounded. Preferably the fuses are wire bonds connecting each lead to ground.

The invention provides an analog voltage probe comprising: a probe circuit board having an analog probe circuit including a plurality of probe input leads and a probe ground; a ground personality circuit board having a ground personality circuit comprising: a plurality of electrical conductors and a ground element, each of the conductors including a terminal adapted to be electrically connected to a circuit under test, and selected ones of the conductors electrically connected to the ground element; and an electrical connector connecting each of the electrical conductors to one of the probe input leads and the ground element to the probe ground. Preferably, each of the terminals is adapted to be connected to one of the pins of the circuit under test, and the selected ones of the conductors are those corresponding to the pins of the circuit under test that are connected to the device ground. Preferably, the electrical connector comprises an elastomer element compressible between the probe circuit board and the ground personality circuit board. Preferably, the ground personality circuit board includes a fusible element connecting the selected ones of the conductors to the ground element.

In another aspect the invention provides an analog voltage probe comprising: an analog amplifier; a plurality of terminals each adapted to be connected to one of the pins of the circuit under test; a plurality of probe input leads, each of the leads connected to one of the terminals and connectable to the analog amplifier; a probe ground; and a fusible element connecting each of the probe input leads to the probe ground. Preferably, the fusible element comprises an integrated circuit bond wire. Preferably, the bond wire fuses at between 0.5 amperes and one ampere current. Preferably, the bond wire comprises a metal selected from the group consisting of gold, aluminum, and platinum. Preferably, the analog amplifier is on a probe circuit board and the fusible elements are on a ground personality circuit board separate from the probe circuit board.

In a further aspect the invention provides a method of making an analog voltage probe, the method comprising:

providing a probe circuit comprising: an analog amplifier; a plurality of terminals each adapted to be connected to one of the pins of the circuit under test; a plurality of probe input leads, each of the leads connected to one of the terminals and connectable to the analog amplifier; a probe ground; and a fusible element connecting each of the probe input leads to the probe ground; and fusing selected ones of the fusible elements corresponding to the active pins of the circuit under test. Preferably, the step of fusing comprises connecting the probe circuit to a simulated circuit under test having a plurality of pins, and applying a voltage to selected ones of the pins. Preferably, the step of fusing comprises: connecting the probe circuit to a device having a plurality of pins corresponding to the pins of the device under test, each pin electrically connected to one of the terminals; placing an insulating cap on the ones of the pins that are designated as grounds in the circuit under test; and applying a voltage to the remainder of the pins. Preferably, the voltage is between 3 volts and 5 volts.

In yet another aspect, the invention provides a method of making a voltage probe of the type connectable to a circuit to be tested, the circuit to be tested having a circuit ground and a plurality of circuit nodes, the method comprising the steps of: providing an analog voltage probe comprising a probe circuit board including a probe ground and a plurality of input leads, each of the input leads comprising a trace on the circuit board, and each of the plurality of input leads adapted to be connected to a specific one of the circuit nodes; and connecting each of the input leads corresponding to selected ones of the circuit nodes to the probe ground. Preferably, the step of connecting comprises selecting which of the circuit nodes are connected to circuit ground and connecting to probe ground each of the input leads corresponding to the nodes selected to be connected to circuit ground. Preferably, the step of connecting the input leads to the probe ground comprises: providing a ground personality board including a plurality of conductors, a ground element, selected ones of the plurality of conductors being connected to the ground element; and electrically connecting the ground personality board to the probe circuit board with each of the input leads corresponding to selected ones of the circuit nodes being connected to one of the selected conductors, and the ground element being connected to the probe ground. Alternatively, the step of connecting the input leads to the probe ground comprises soldering. Preferably, the step of selecting is performed by the user of the circuit. Preferably, the step of connecting comprises maximizing the number of the selected circuit nodes and therefore maximizing the number of connections between the circuit ground and the probe ground. Preferably, the step of providing further includes providing a plurality of intermediate leads, each intermediate lead located between an adjacent pair of the input leads, and the step of connecting further comprises connecting each of the intermediate leads to the probe ground, whereby each of the input leads is separated from adjacent input leads by a grounded intermediate lead.

The invention not only provides a hand held voltage probe that includes hundreds of probe channels while maintaining high band width and high signal integrity, it also does this simply, thereby allowing the probe to be manufactured relatively inexpensively. Numerous other features, objects and advantages of the invention will become apparent from the following description when read in conjunction with the accompanying drawings.

DESCRIPTION OF THE PREFERRED EMBODIMENT

1. Overview

Figure 1:
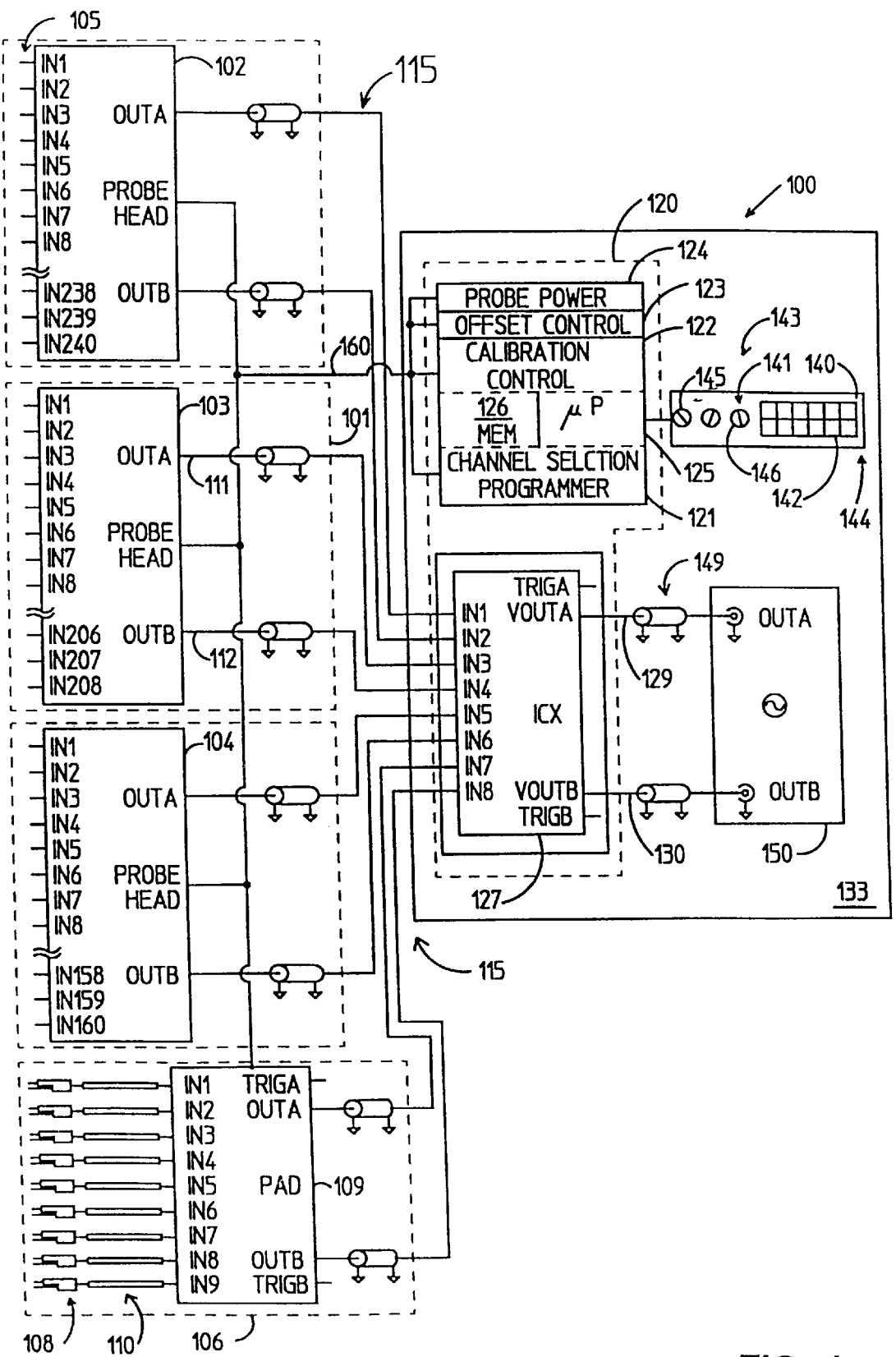
FIG. 1 is a block circuit diagram of the preferred embodiment of an electronic probe system according to the invention.

FIG. 1 shows the preferred embodiment of an analog voltage probe system 100 in which the invention is implemented. It should be understood that the specific system shown in the figures and described herein, is exemplary. That is, it is intended to show preferred examples of the invention so that those skilled in the art can fully understand and implement it. It is not intended to limit the invention to the specific examples described and shown herein.

In this disclosure, the term "electrically connected" when applied to two electrical elements, such as an input and an output, means that an electrical signal, such as a voltage, a current, an analog signal, or a digital signal, will pass from one element to the other. This is in distinction to a physical connection by electrical components. For example, an input and an output may be physically connected by wires, amplifiers, transistors, resistors and other electrical components, but no signal will pass from the input to the output because one or more of the switching or amplification components may be off. In this case, the input and output are not "electrically connected". In this disclosure "amplifier" means an electronic circuit that passes signals, usually changing the amplitude, without significant distortion, and includes 1:1 amplifiers as well as negative amplifiers, not just amplifiers with a positive gain.

Figure 5:
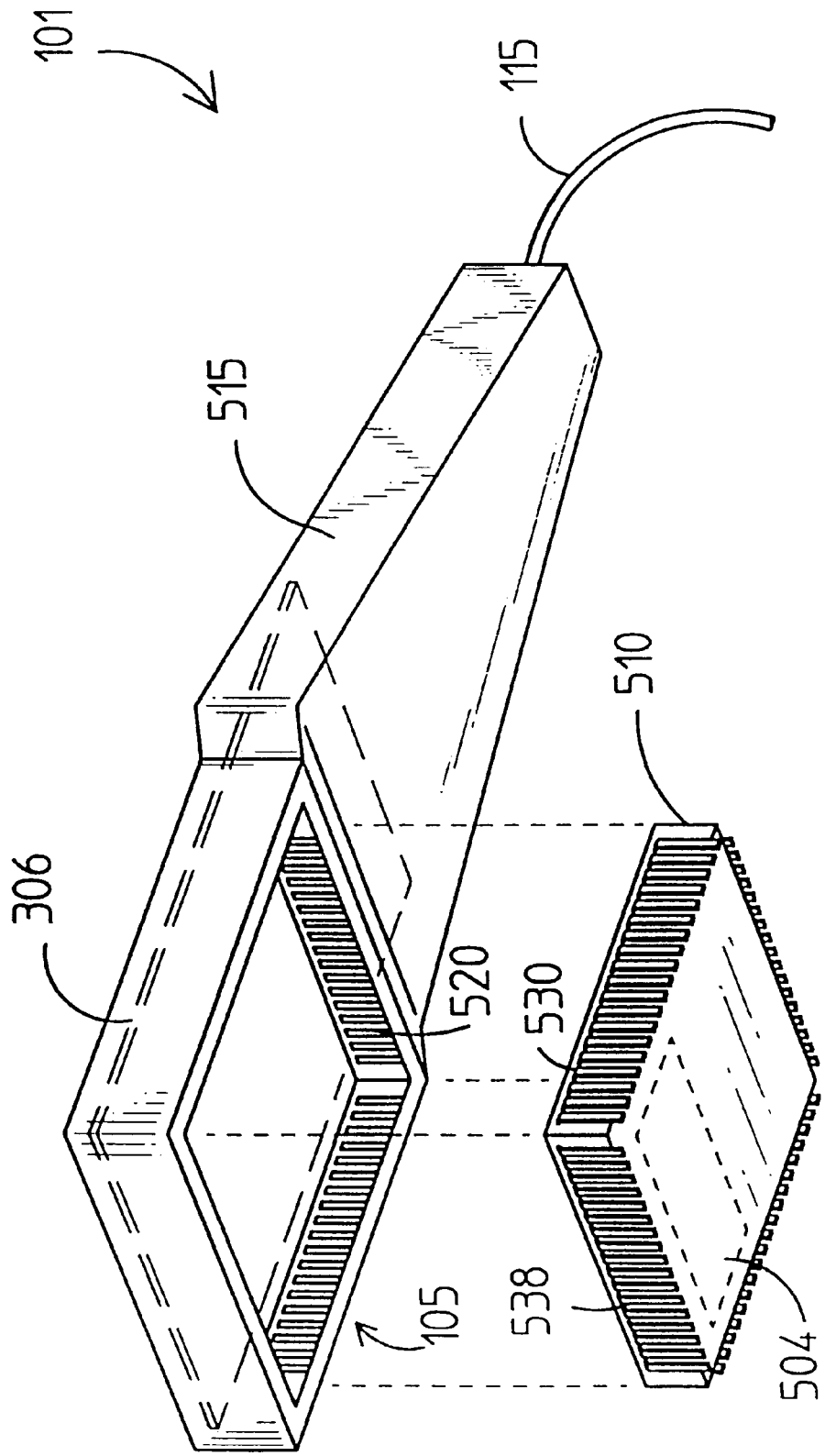
FIG. 5 is a perspective view of a probe head according to the invention and a PQFP showing how the probe head attaches to the PQFP.

Probe system 100 includes three plastic quad flat pack (PQFP) probes, such as 101, each of which include a probe head, such as 103, and two of coaxial cables 115. Each of probe heads 102, 103 and 104 has a specific number of inputs 105 and is mechanically enclosed in a probe body 515 (FIG. 5), which probe body is designed to be easily held in one hand and easily mechanically coupled to a specific plastic quad flat pack (PQFP) 510 (FIG. 5). The circuitry of the probe head, such as 103, is located on a circuit board 306 (FIGS. 5 and 6) in the probe body 515. The probe inputs 105 in the form of a pod array 520 are designed to be easily electrically coupled to the inputs of the specified PQFP. For example, probe head 102 is designed to couple to a PQFP with 240 pins, probe head 103 is designed to couple to PQFP with 208 pins 530, while probe head 104 is designed to couple to a PQFP having 160 pins.

The exemplary probe system 100 also includes a general purpose single point probe 106, which includes nine probe tips 108 and a circuit pod 109. Each probe tip 108 is connected to pod 109 via a 50 ohm coaxial cable 110. General purpose probe 106 may be used to probe circuits for which no specific probe head is available.

The probe system 100 has two outputs 129 and 130. Likewise most of the system components, such as probe heads 102–104 and pod 109 have two outputs, such as 111 and 112. In each case we shall refer to one output as the "A" output and the other as the "B" output. Each probe head 102, 103, 104 can connect any of its inputs 105 to either or both of its outputs. For example, probe head 103 can connect any of its 240 inputs to either or both of its outputs, 111 and 112. Each of the separate paths through the system that a signal can follow from a selected one of the inputs 105 or probe tips 108 to a selected one of the probe outputs 129 and 130, defines a channel. In the case of the probe 100 and its components in general, half the channels pass through the "A" output 129 and half through the "B" output 130. As a shortened notation, in some instances below we shall refer to electronic circuits or elements on the "A" output side of the system, or to a component as an "A" or "B" channel component.

Probe system 100 also includes a printed circuit board (PCB) 120 which fits into a logic analyzer 133 designed to interface with the probe, which logic analyzer is sometimes referred to in the art as a "main frame". PCB 120 contains a channel selection programmer circuit 121, a calibration control circuit 122, an offset control circuit 123, and a probe power circuit 124, which circuits share a microprocessor 125 and its associated memory 126; e.g. the channel selection programmer 121 includes memory 126 and microprocessor 125 in that channel selection software stored in memory 126 is used by microprocessor 125 to provide output signals that cause the programmer 121 to output data via cable 160 to program latches (not shown) in the probe 100. Microprocessor 125 and memory 126 are not on PCB 120 but are in main frame 133, and thus are shown with a dotted line around them. The various circuits 121 through 126 on PCB 120 include other electrical elements and interconnections that, to those skilled in the art, will be clear from the following description.

PCB 120 also includes a second level multiplexer 127. Multiplexer 127 is implemented as an integrated circuit (IC) die on PCB 120, and is capable of connecting any of its 8 inputs to either or both of its outputs, 129 and 130. In addition, probe system 100 includes means 140 for inputting control signals, such as for programming second level multiplexer 127, probe heads 102–104, and pod 109. In the preferred embodiment, means 140 includes dials 141 and a keyboard 142, though almost any mechanism for generating electrical control signals may be used. In the preferred embodiment, the dials 141 are located on the front of the logic analyzer 133, and the keyboard is a computer work station keyboard; however, for simplicity they are shown on a common control signal input means 140. In the preferred embodiment several dials 145 together with channel selection programmer 121 comprise selection means 143 for selecting one of the probe inputs 105, 108 and one of the probe outputs 129 or 130, while one dial 146 together with channel selection programmer 121 comprise gain selection means 144 for selecting one of a plurality of possible gains for signals passing from said selected input to said output.

The outputs 111, 112, of probe heads 102–104 and pod 109 are connected to second level multiplexer 127 via standard 50 ohm coaxial cables 115. The outputs 129, 130 of second level multiplexer 127 are connectable to a test instrument, such as an oscilloscope 150, via 50 ohm coaxial cables 149. Control PCB 120 is connected to probe heads 102–104, pod 109 and second level multiplexer 127 via a multiwire cable 160. Multiwire cable 160 includes conventional power lines, a serial interface including data and clock lines, and other lines. In the preferred embodiment, coaxial cables 115 and wires 160 are bound together in a single cable.

In one embodiment, invention also includes a ground personality board 810 (FIG. 8) that is sandwiched between the circuit board 806 (FIG. 8) and the coupling to the pins 530 of the PQFP. The ground personality board allows the probe to be customized to a particular PQFP design.

Figure 3:
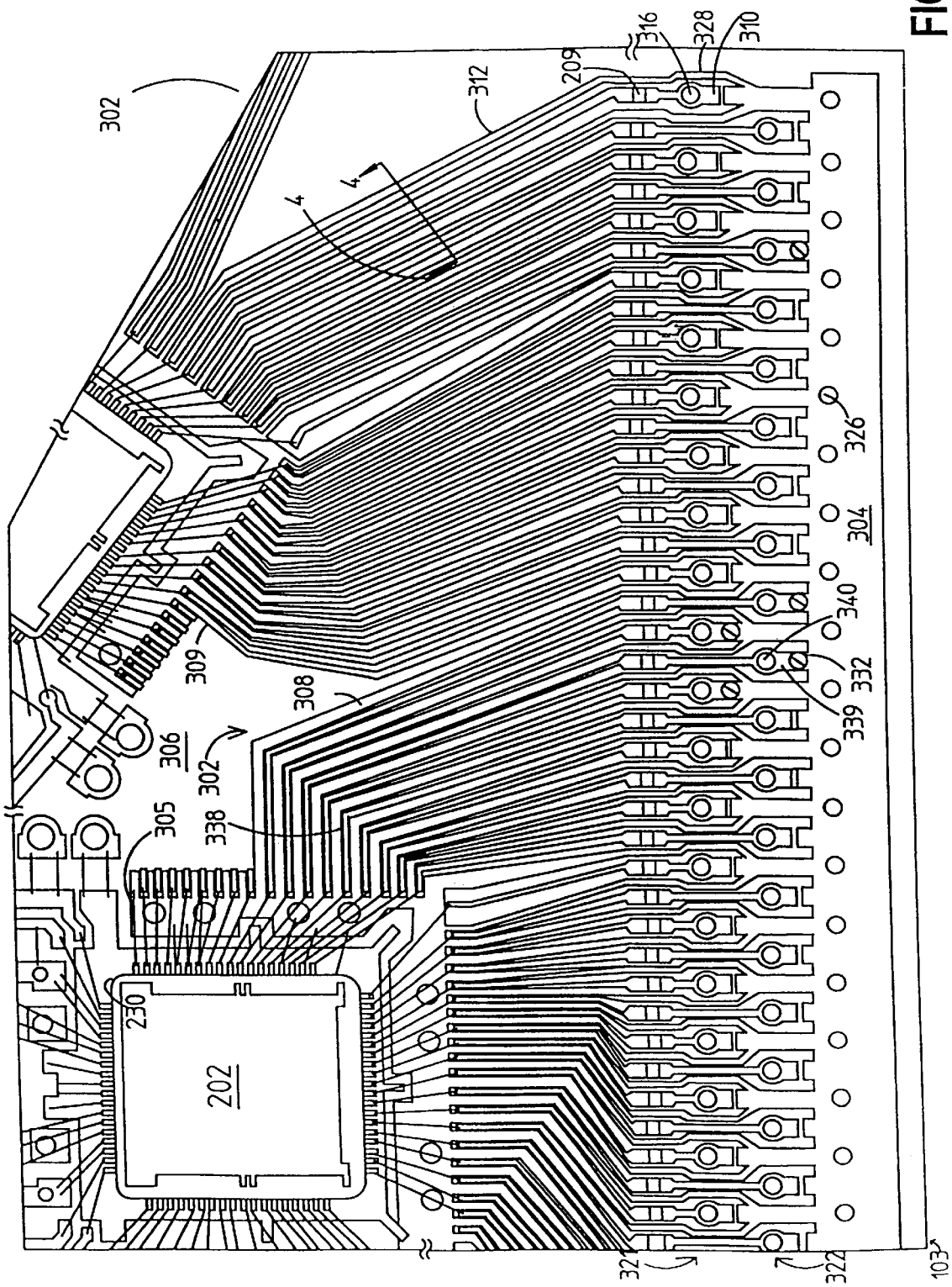
FIG. 3 is a detail of the circuit board containing the probe head circuit of FIG. 2, showing the structure and arrangement of the circuit including leads and integrated circuit chips.

As can be seen from the above description of the probe system, it includes hundreds of channels that are packed into a device, such as probe head 103, that can be held in one hand. Obviously, the channels must be physically very close to one another. FIG. 3 shows a portion of a probe head that is about one-half inch along the horizontal dimension. This portion includes about 50 leads 302 that connect to integrated circuit chips, such as 202, all of which are on a printed circuit board 306. The invention involves the physical design and structure of the leads 302, circuit board 306, probe head circuit 303, and integrated circuit chips which permits so many channels to be packed so densely while at the same time retaining the high signal integrity and band width required for instrumentation purposes and permitting the customization probe to be easily changed for use with different PQFP's or other IC devices.

2. Detailed Description

Figure 2:
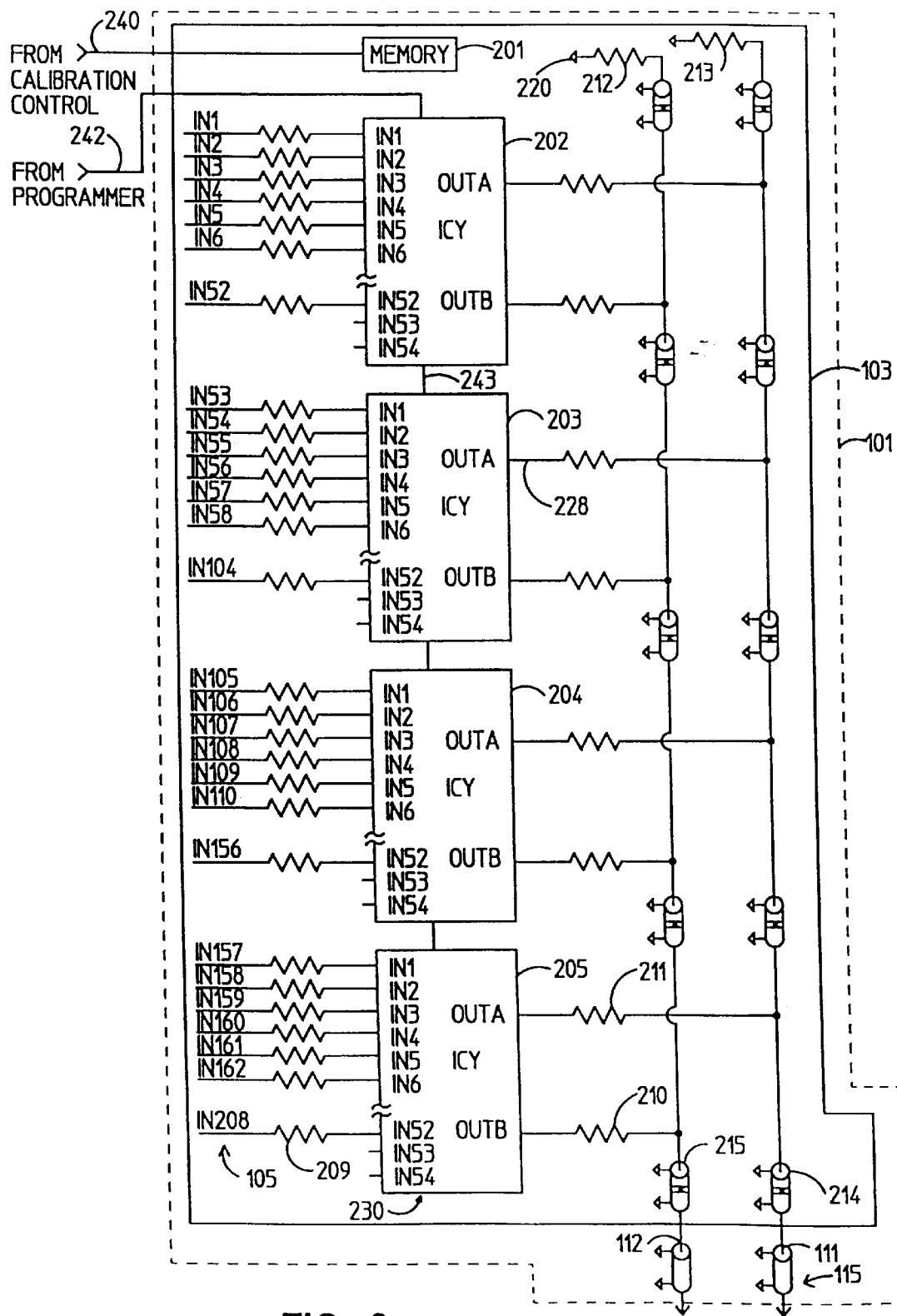
FIG. 2 is block circuit diagram of a typical high density plastic quad flat pack (PQFP) probe head of the probe system of FIG. 1.

Turning to FIG. 2, a semi-block circuit diagram of two-hundred-and-eight pin PQFP probe 101 is shown. Probe 101 includes probe head 103 and coaxial cables 115. Probe head 103 includes memory 201, four custom integrated circuit chips 202–205, two-hundred-and-eight probe inputs 105, two-hundred-and-eight input resistors, such as 209, eight output resistors, such as 210, 50 ohm microstrip "coax" 214 and 215, and microstrip terminating resistors 212 and 213.

Memory 201 is connected to calibration control circuit 122 (FIG. 1) through wire cable 240, preferably a serial interface connection, in cable bundle 160. Integrated circuit chip 202 is connected to channel selection programmer 121 via cable 242 in cable bundle 160, also preferably a serial interface connection. Each of chips 202 through 205 is serially connected to the next chip via a circuit connection such as 243. This connection via line 242 and integrated circuit connections such as 243 transfers data sequentially through latches (not shown) in the IC's to program which of the probe channels will be active, that is, which probe channels will pass a signal to test instrument 150. Each of probe inputs 105 connect to one of IC input pins 230 through a resistor 209. Each of IC chips 202–205 include an "A" output and a "B" output. Each of the "A" outputs connect to probe head output 111 through a resistor 210 and via stripline 214. Each of the "B" outputs connect to probe head output 112 through a resistor 211 and via stripline 215. Each stripline 214, 215 is connected to ground via terminating resistors 212, 213 respectively. Note that in this disclosure ground is indicated by a triangle, such as 220.

Resistors 209 are each preferably 150 ohm resistors imbedded in the printed circuit board 306 (FIG. 3) of the probe head 103. Resistors 210, 211, 212, and 213, are preferably 50 ohms. Each of IC chips 202–205 is identical and is a custom integrated circuit chip as will be described below.

Turning to FIG. 3, a portion of a probe head 103 and probe head circuit 303 is shown. This portion of the probe head 103 has been greatly expanded to show the detail; the actual size of the portion shown is approximately three-eighths by one-half inches, though the various parts may not be to scale. The portion of probe head circuit 303 in FIG. 3 includes one integrated circuit chip 202 and a portion of another, leads 302, and a ground element 304. Leads 302 are connected to the input pins 230 of chips 202, preferably by wire bonds 305. Leads 302 include input leads, such as 308, which connect the chip 202 with inputs 105, and intermediate leads 309 which connect chip 202 with ground element 304. Each input lead 308 includes a terminal 310, a buried resistor 209, and a trace portion 312. The terminal portion 316 is connected to pod array 520 (FIG. 5) by means of a plated through via 316. The terminals 310 are in a pair of staggered rows 321 and 322. Ground element 304 is connected to bottom ground plane 412 (FIG. 4) by way of plated through vias, such as 326. There are sufficient such vias 326 so that ground element 304 can be considered to be an extension of ground plane 412. Insulating gaps, such as 328, separate input leads 308 and intermediate leads 309. For selected ones, such as 338, of input leads 308, the gaps 328 are spanned by conductors, such as 332, which connect these certain input leads 338 to the ground element 304. We shall see below how these input leads 338 are selected.

Figure 4:
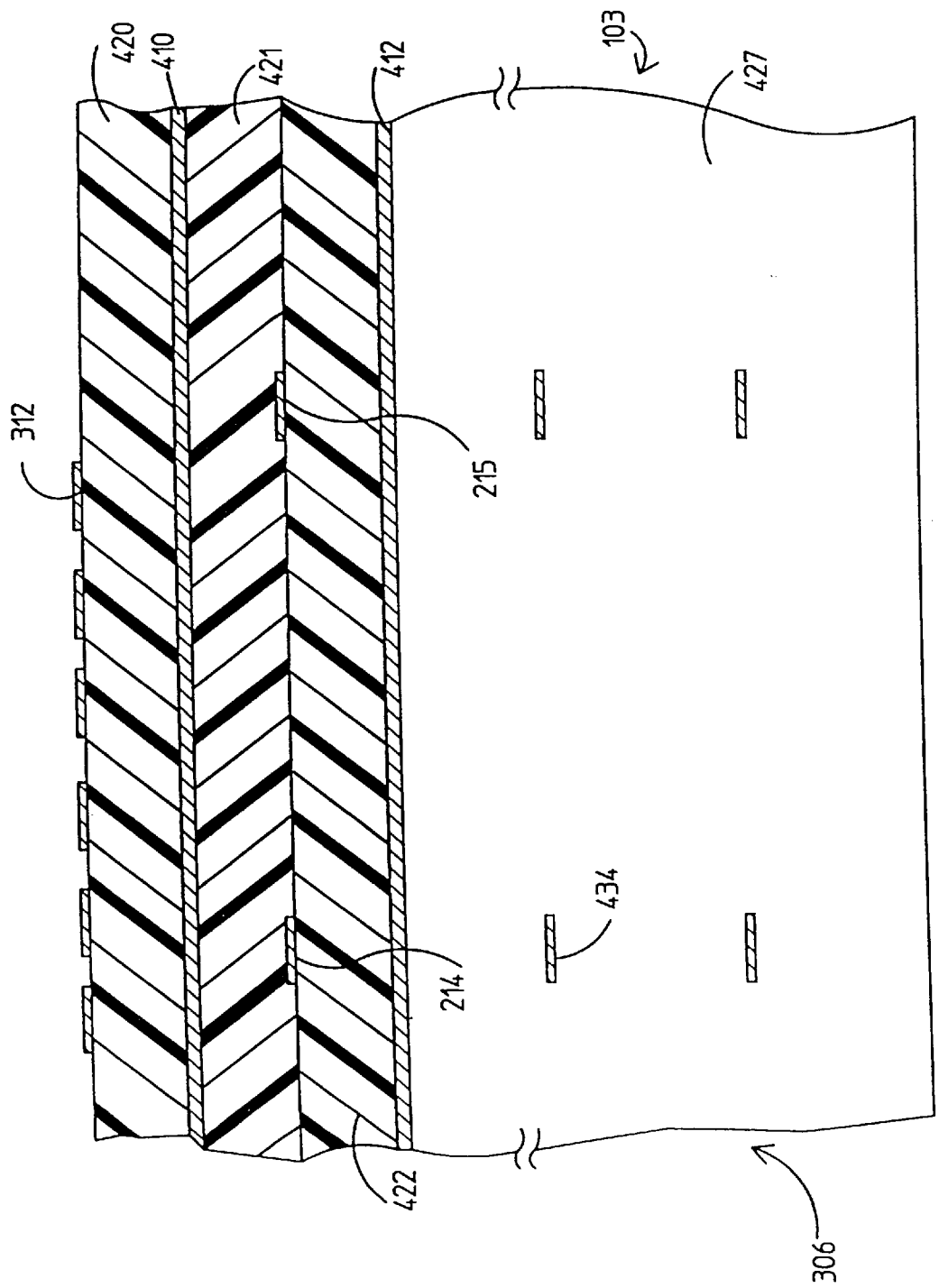
FIG. 4 is a cross section through the line 4—4 of FIG. 3.

A cross-section of probe head 103 through line 4—4 in FIG. 3 is shown in FIG. 4. The cross-section shows circuit board 306 and traces 312 formed on the board. Circuit board 306 includes top ground plane 410, bottom ground plane 412 and various other conducting elements, such as 430 and 434, which are separated by insulating layers 420, 421, 422, and 427. Conductors 214 and 215 carry the output signals. Conductors 434 are lines such as 240 and 242 (FIG. 2) which carry data signals to the chips 202, power supply lines, etc.

Preferably, traces 312 are made of gold-plated copper or other suitable trace materials, are between 1 and 4 mils wide, i.e. the horizontal direction in FIG. 4, and between 0.5 and 3 mils thick, i.e. the vertical direction in FIG. 4. Most preferably the traces 312 are between 1 and 3 mils wide and about 1 mils in thickness.

Preferably dielectric layer 420 between traces 312 and ground plane 410 is thin. It has been found that there is a tradeoff here: the thinner the dielectric layer 420, the lower the coupling between the traces becomes, but the higher the input capacitance becomes. Preferably the thickness is between 4 mils and 6 mils. Most preferably it is 5 mils thick. The dielectric constant of material 420 is low, preferably between 0.5 and 5. Most preferably it is 2.2. Dielectric 420 is preferably polytetrafluoroethylene, and most preferably the polytetrafluoroethylene sold under the trademark DICLAD 880 by Arlon Microwave Materials Division, although other materials with the above properties may also be used.

Buried resistors 209 are each preferably 13 mils wide by 20 mils long, made of 100 ohm per square material 5 microinches thick, and are preferably 150 ohms. The use of buried resistors permits the input damping resistance to be located very close to the input, which significantly improves damping of the circuit response. At the same time it permits a high density of resistors. Insulating layer 427 is actually formed in several layers, but the details of these layers are not shown since these details are either redundant of details already discussed or relate to conventional materials and thicknesses. Insulating layers 421 and 422 are preferably made of FR4, which is well-known in the PC board art, or other conventional PC board material.

The combination of thin traces 312 and a thin, low dielectric constant separation between traces 312 and ground plane 410 is critical for providing a high signal integrity and wide band width probe with a high density of channels. The combination of thin traces 302 and thin dielectric material 420 is important for reducing coupling between leads through the ground. The low dielectric constant results in low capacitance between the leads 302 and ground 410.

An important feature of the circuit on circuit board 306 is that every other lead 302 is an intermediate lead connected to ground. Thus, each input lead is separated from every other input lead by a ground. This feature greatly reduces coupling and is also critical for providing high signal integrity and wide band width.

FIG. 5 shows a PQFP probe 101 and a PQFP 510. Circuit board 306 is enclosed in probe body 515 and, as indicated above, makes contact with the pod array 520 by means of plated vias. Pod array 520 forms the inputs 105 to probe 101. It is of a special design which is disclosed in a separate patent disclosure. It is designed to make good electric contact between the nodes of the circuit under test, i.e. the pins 530, 538 of PQFP 510, and the terminals 310 of input leads 308.

An important feature of the probe 101 is that it is designed so that its ground 304 and the ground 504 of the circuit 510 under test can be made as close as possible. That is, the ground potential of the ground 304 and the ground 510 are essentially the same. The ground 504 of PQFP 510 is shown only generally and in ghost in FIG. 5 since it will usually be an element similar to element 304 of FIG. 3 that is located within the flat pack structure. The two grounds 304 and 504 are made as close as possible by maximizing the number of probe leads 308 that are connected to both the probe ground element 304 and the ground 504 of the circuit 510 to be tested. This is facilitated by allowing the user of the probe to define the pins 538 on the circuit 510 which are to be grounded, and then designing the probe so that all probe input leads 308 that correspond to grounded pins 538 on the circuit 510 under test are connected to the probe ground element 304. That is, the user, when ordering a probe system 100, will specify certain desired features, such as the number of probe heads 102, 103, etc., the number of inputs 105 desired for each probe head, and the particular circuit package that the probe head is to mate with, such as a PQFP. According to the invention, the user will also designate which selected pins 538 of the package 510 are grounds. Probe heads 102, 103, etc. are then manufactured as described above, or premanufactured probe heads are taken from inventory. Selected ones, such as 338, of the input leads 308 correspond to a grounded pin 538; that is, selected leads 338 connect to a grounded pin 538 by means of terminals, such as 339, vias, such as 340, and pod array 520. Before shipping to the customer, electrical connections are made between each of the input leads 338 which correspond to a grounded pin 538, and the ground element 304. Preferably this electrical connection is made by simply applying a drop of solder between the terminal 339 of the lead 338 and the ground element 304, as shown at 332. Thus, the ground plane 412 of the probe head 103 is then connected to the ground of the circuit 510 under test. The more of the leads 308 that are connected to grounded pins 538 and to ground element 304, the less the total impedance between the grounds of the circuit 510 and the probe 103, and the closer the potential of the grounds will be. By the manufacturing method of the invention just described, the number of input leads that connect the grounds of the probe head 103 and the circuit 510 is maximized. Thus, signal distortions and other potential problems caused by fewer grounds are minimized.

From the above it is seen that in the usual applications of the invention both the intermediate leads 308 and selected ones 338 of the input leads will be connected to ground element 304. Those ones 311 of the input leads 308 that are not connected to ground, but rather are connected to pins 535 of circuit under test that are active, i.e. carry a signal at some point in the cycle of the circuit 510, are referred to herein as "active leads" 311.

Figure 8:
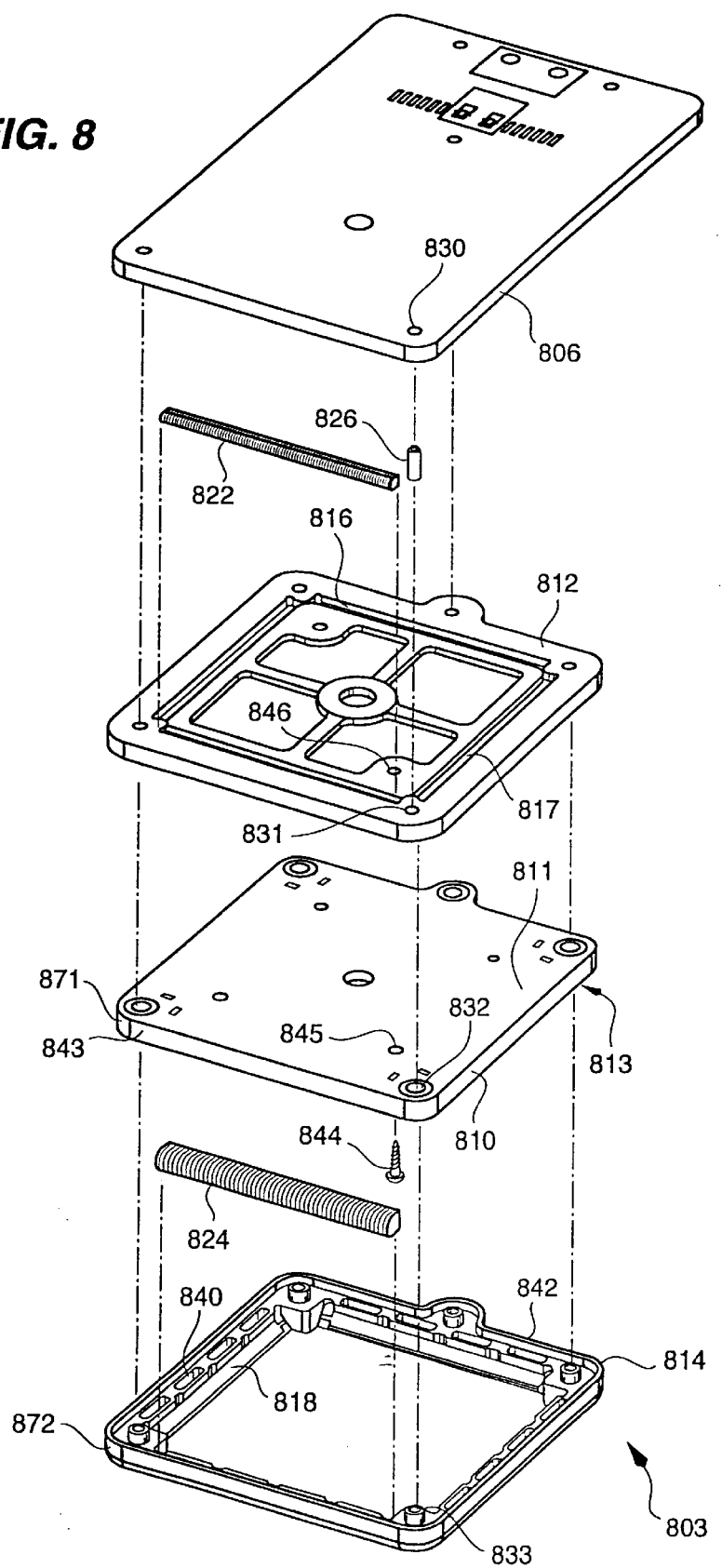
FIG. 8 is an exploded view of a portion of the probe head of an alternative preferred embodiment of the invention showing the circuit board, the ground personality board, and the connections between these boards.
Figure 9:
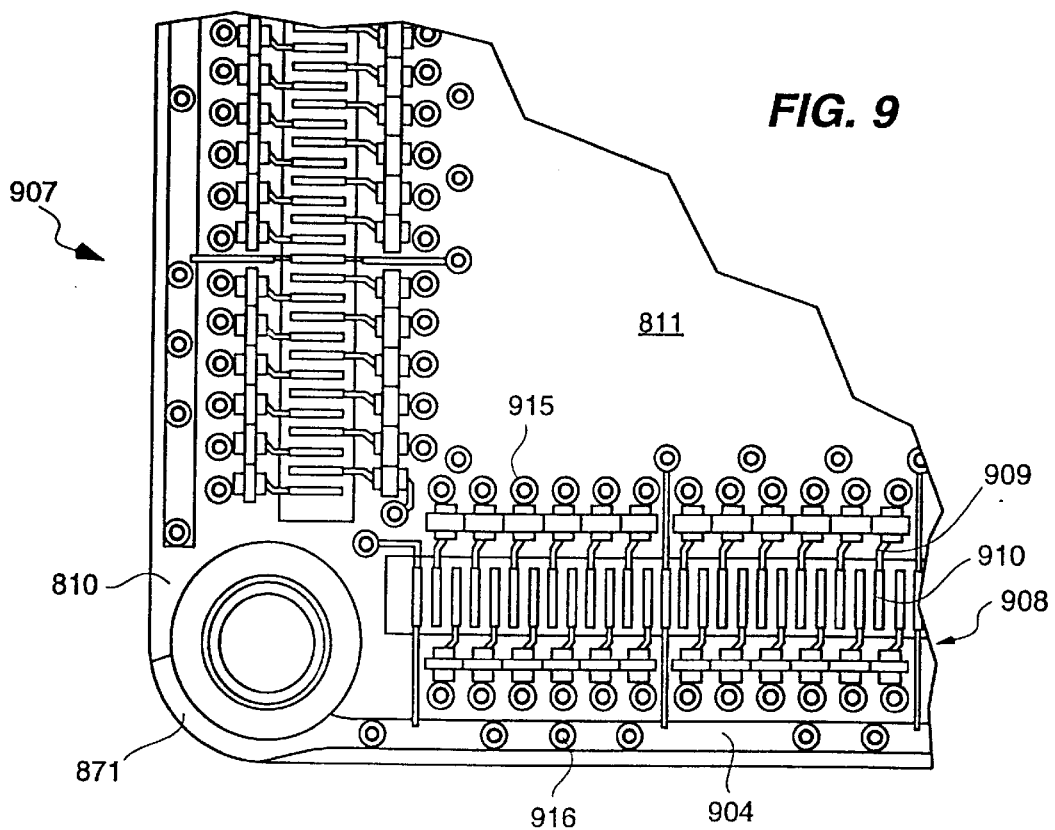
FIG. 9 shows in detail an exemplary portion of one side of the ground personality board of FIG. 8.
Figure 10:
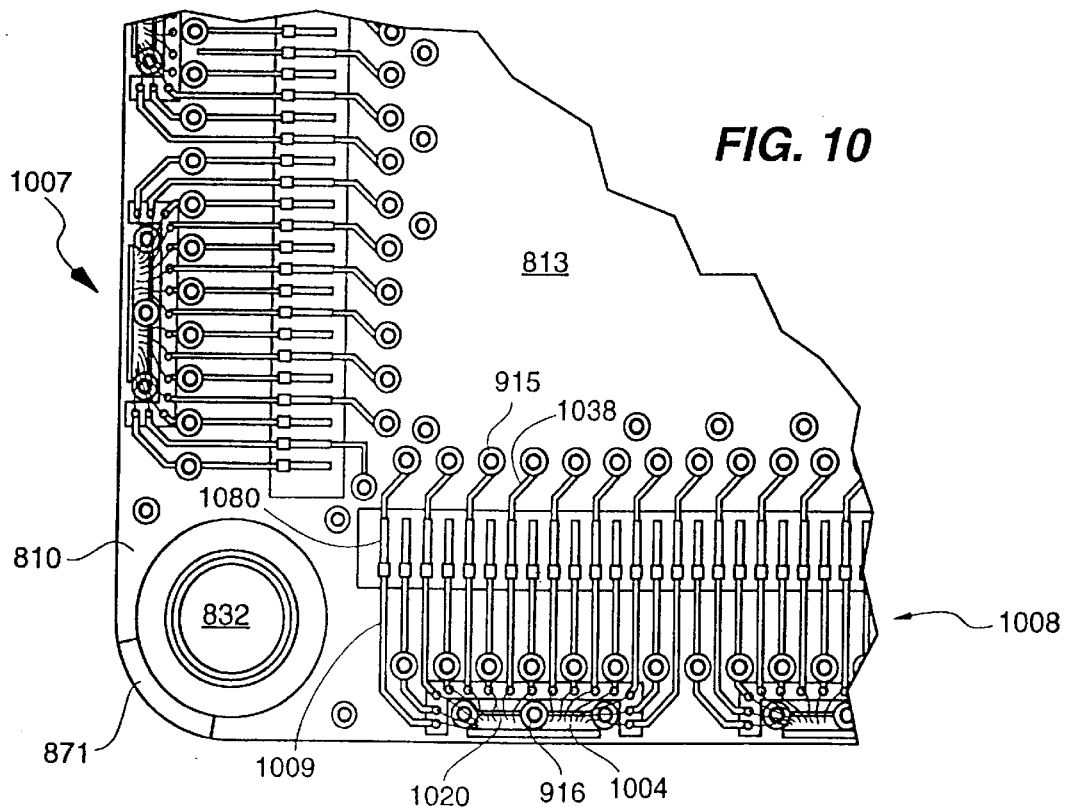
FIG. 10 shows in detail an exemplary portion of the other side of the ground personality board of FIG. 8.

FIGS. 8 through 10 show an alternative and preferred embodiment of a probe 101 in which the leads that are not active are grounded. In this embodiment, instead of the individual leads 338 on the circuit board 306 that are selected to be grounded being grounded by a solder ball 332, a separate board 810 is provided that includes a circuit (FIGS. 9 and 10) that connects each of the selected leads to ground.

FIG. 8 shows an exploded view of a portion 803 of a probe head showing a circuit board 806, the ground personality board 810, a first board-to-board cassette 812 which locates the electrical connectors 822 which connect the circuit board 806 to ground personality board 810, and a second cassette 814 which locates the electrical connectors 824 between the ground personality board 810 and the pins 530 (FIG. 5) of a circuit under test 510 or the pins 1130 a simulated circuit under test 1110 (FIG. 11) on the calibration board 1105. For simplicity, the details of the circuits on circuit board 806 and ground personality board 810 are not shown in FIG. 8.

Circuit board 806 is identical to circuit board 306 except that it does not contain the solder connections 332. Rather than provide an extra figure that reproduces FIG. 3 without the solder balls, we shall discuss the circuit of board 806 by reference to FIG. 3 and refer to the elements of the circuit of circuit board 806 by the same numbers as the elements of the circuit of circuit 306. Cassette 812 includes four rectangular slots 816. An elastomer electrical connector member 822, which is embedded with fine wires, fits into each of slots 816 to connect the terminals 310 and ground plane 304 of circuit 806 to the terminals 910 (FIG. 9) and ground plane 904 on the first side 811 of ground personality board 810. Similarly, cassette 814 includes four rectangular indentations 818 ito which fit four elastomer connectors 824 which connect the terminals 1010 (FIG. 10) on the bottom or second side 813 of ground personality board 810 with the pins 530 of a circuit under test 510. Cassette 814 also includes sixteen oblong recesses 840 which provide space for the fuse wires 1020 so they are not crushed. Cassettes 812 and 814 are made of an insulating material, such as a polycarbonate, other plastics, or other moldable insulating material. The details of the elastomer connectors 822, 824 and how they function are described in U.S. Pat. No. 5,314,342. Dowels, such as 820, fit in bores, such as 830–833, in the circuit board 806, ground personality board 810, and cassettes 812, 814 to align the boards and cassettes. Each of the cassettes 812 and 814 includes a rim, such as 842, which is of a dimension so that the edge 843 of ground personality board snap-fits into the rim 842. The rim is not shown on cassette 812 since it is on the bottom side which is not visible in FIG. 8. Thread forming screws, such as 844, which screw into bores such as 845 and 846, fasten the assembly to the probe body 515, compressing the elastomer connectors 822, 824 and making electrical contact between the circuit boards 810 and 812.

FIG. 9 shows the top or first side of ground personality board. The board 810 includes a circuit 907 that includes ground plane 904, conductors 908, each of which includes a trace 909 and a terminal 910, and plated through vias 915, 916. Circuit 907 is designed to connect to the circuit on circuit board 806. Conductors 908 are made of gold-plated copper or other suitable trace materials. Ground plane 904 is made of copper. FIG. 10 shows the bottom or second side 813 of ground personality board 810. This side of the board includes a circuit 1007 that includes conductors 1008, each of which includes a trace 1009 and a terminal 1010, ground planes 1004, and fuses 1020. As can be seen by comparing the two sides 811, 813 of board 810, each of vias 915 connect one of terminals 910 to one of terminals 1010, and each of vias 916 connect the ground plane 916 with the ground plane 1004. Electronically, each of ground planes 1004 is an extension of ground plane 904 because of their connection by way of vias 916.

Prior to calibration of the probe 101, each conductor 1008 is connected to one of the ground planes 1004 by a thin fuse, which in the preferred embodiment is an integrated circuit bond wire. Preferably fuse wire 1020 is made of gold, aluminum, platinum or other suitable bond wire that is of an appropriate thickness so that it melts at about 0.5 amperes to 1 ampere current. Typically fuse wire 1020 is a 0.8 mil gold wire that fuses at about 0.8 or 0.9 amperes. Platinum wires typically fuse at lower amperages, such as about 0.5 amperes, thus may be used when it is particularly important to protect the elastomer connectors 822, 824.

Returning to FIG. 8 and considering FIGS. 3, 9, and 10, it is seen that each of traces conductors 1008 is an extension of one of leads 308 on circuit board 806, since each terminal 1010 is connected to one of terminals 910, which in turn is connected to one of terminals 310 via cassette 812 and elastomer 822. Thus, prior to calibration, each of leads 308 is connected to ground. In the calibration process, each of fuse wires 1020 that is connected to a conductor 1008 that corresponds to an active lead 311 is fused, disconnecting that lead from ground.

Figure 11:
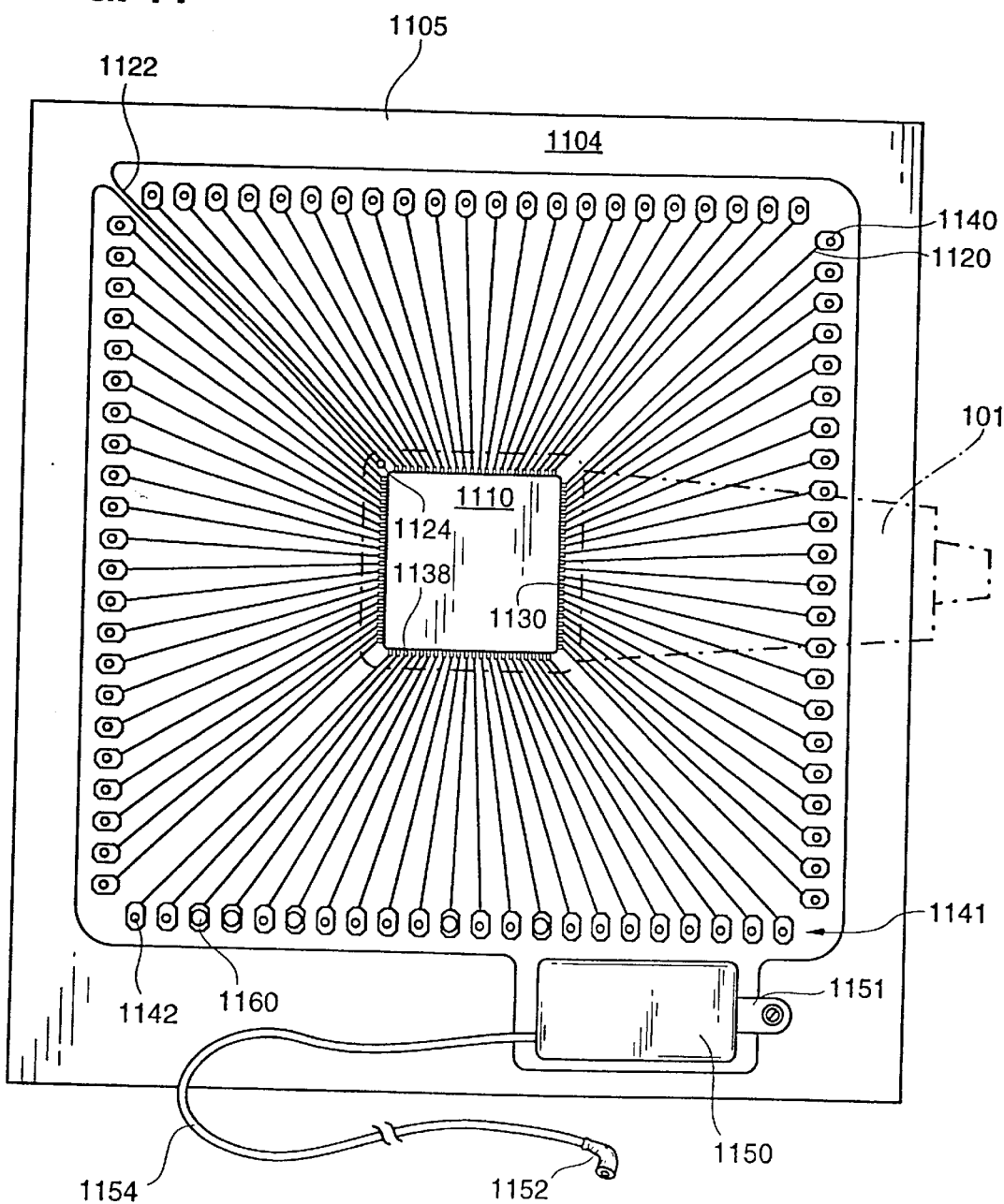
FIG. 11 is a plane view of a calibration board and illustrates the method of blowing the wire-bond fuses.
Figure 12:
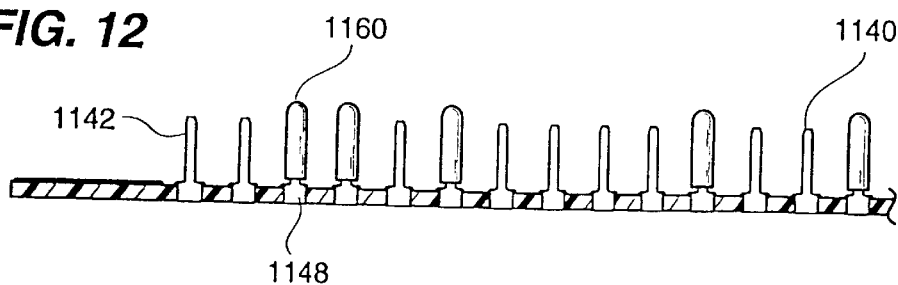
FIG. 12 is a cross-section of the calibration board of FIG. 11.

Turning to FIGS. 11 and 12, a calibration board 1105 is shown. FIG. 11 shows a plane view of the calibration board 1105, while FIG. 12 shows a sectional view through the lower row of pins 1140. It should be understood that only the portions of calibration board 1105 that are relevant to the present invention are shown, and that, in general, calibration board 1105 will include many other features. Calibration board 1105 includes a simulated or dummy circuit under test 1110, terminal pins 1140, traces, 1120, a ground plane 1104, and a power source 1150. A probe 101 is shown in ghost in FIG. 11 in the position it is in when it is calibrated. Dummy circuit under test 1110 has the same shape and number of pins 1130 as the actual circuit under test to which the probe 101 is to be applied. Each circuit under test pin 1130 is connected to a terminal pin 1140 via a trace 1120. The traces 1120 fan out from the simulated circuit under test so that the terminal pins 1140 are sufficiently separated to be easily addressed manually, and so that each pin 1140 can be of sufficient size and strength to withstand many thousands of calibration operations. Ground traces, such as 1122, connect ground plane 1104 with a contact 1124 on probe 101 that connects via contacts 871 and 872 (FIGS. 8 and 9) to the ground plane 1004 of the ground personality board 810. A ground connector 1151 connects power source 1150 to the calibration board ground plane 1104. Power source 1150 has an output of between 3 and 5 volts, and preferably about 4 volts, and from 0.5 to 2.0 amperes. A connector tip 1152 is connected to power source 1150 via a flexible connector 1154. Insulating caps 1160 cover the ones of calibration board terminal pins 1148 that are connected to simulated circuit under test pins 1138 that are to be grounded.

A probe 101 (FIGS. 5 and 11) is calibrated by first determining which of pins 1130 are to be grounded, and then putting an insulating protective cap 1160 over each of the calibration board terminal pins 1148 that are connected to these pins 1138. The probe 101, shown in ghost in FIG. 11, to be calibrated is pressed down on simulated circuit under test 1110 so that each of pins 1130 connect to one of terminals 1010 on board 810 and contact 1122 electrically connects to ground plane 1004 via contacts 871 and 872 (FIGS. 8 and 9). The terminal pins 1142 that are not capped, are then contacted by connector tip 1152 which applies an approximately 4 volt, 1 amp spike of power across the bond wire fuse 1020 (FIG. 10) that connects to the one of conductors 1008 that connects that pin to ground 1010. The circuit is closed through contact 1124, ground trace 1122, ground plane 1104, and ground connector 1151. The current spike fuses the wire 1020, disconnecting that terminal and its corresponding pin from ground, and thus permitting the corresponding lead 308 (FIG. 3) to be an active lead 311. This completes the manufacturing process for the particular ground personality board 810.

It is a feature of the invention that a different ground personality board 810 may be manufactured for each different circuit under test 510 with which the probe 101 is intended to be used. When the probe 101 is to be used with a particular circuit under test 510, the corresponding ground personality board 810 is inserted in the probe body 515. Thus, at a relatively small cost, a probe 101 can be customized for use with a particular circuit under test 510.

Figure 7:
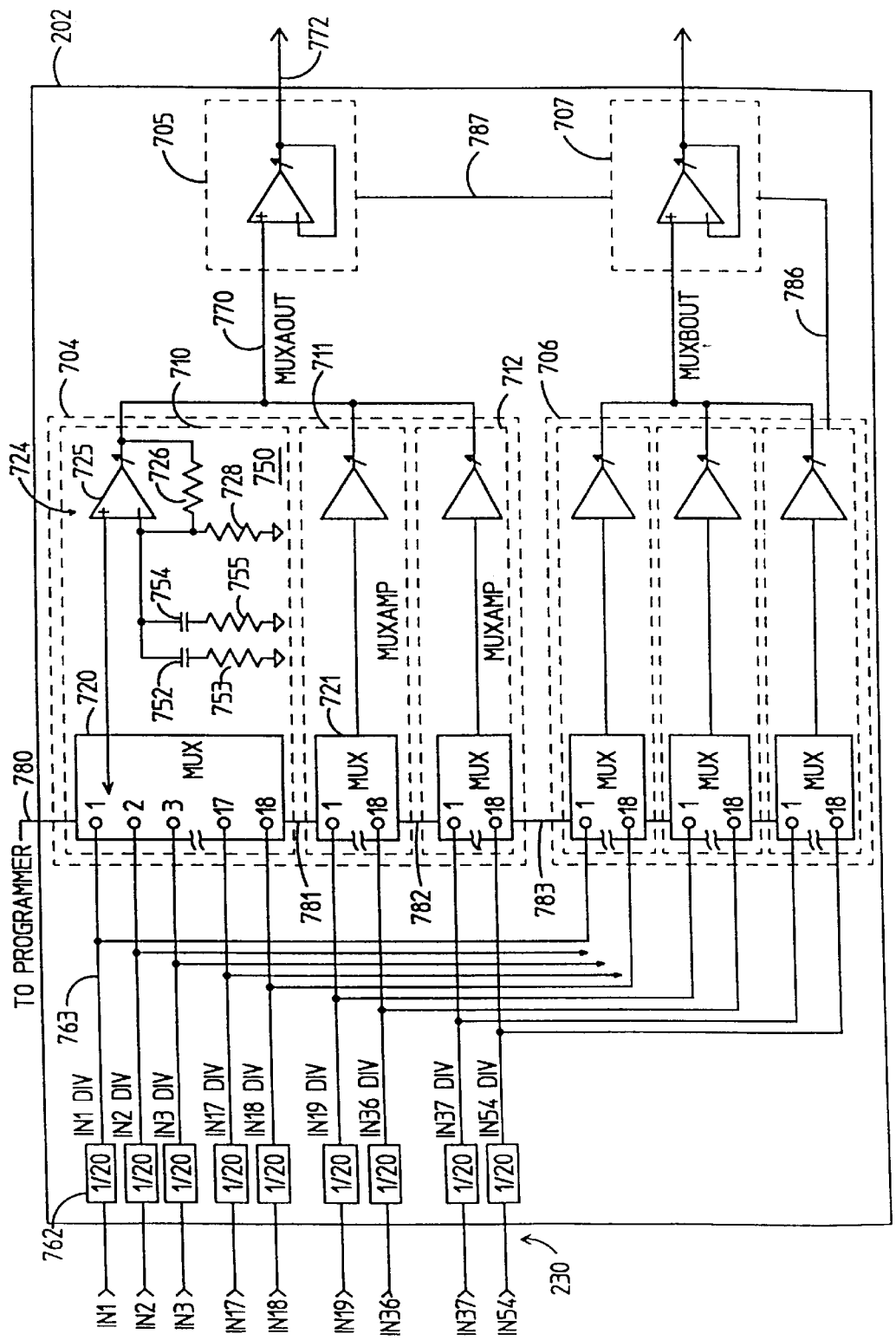
FIG. 7 is a block circuit diagram of an integrated circuit chip of FIG. 3.

FIG. 7 is a block circuit diagram of an integrated circuit chip 202. Chip 202 includes an "A" channel muxamp 704 and programmable output stage 705 and a "B" channel muxamp 706 and programmable output stage 707. The "A" and "B" channels are identical and thus only one will be described. Muxamp "A" 704 is a 54:1 muxamp that includes three 18:1 muxamps 710, 711, and 712. Again, each of these three muxamps are identical, and thus only muxamp 710 will be discussed in detail. Muxamp 710 can be thought of as an 18:1 multiplexer 720, a feedback differential amplifier 722, and a cable compensation circuit 750 comprising resistors 753 and 755 and capacitors 752 and 754. Feedback amplifier 724 includes programmable amplifier 725 and a feedback and voltage divider circuit comprising resistors 726 and 728.

IC chip 202 includes 54 inputs, though for simplicity only nine are shown. Each input is connected to a $\frac{1}{20}$ input divider, such as 762, and each input divider is connected to one input of "A" muxamp 704 and one input of "B" muxamp 706. The output 770 of muxamp 704 is connected to the input of programmable output stage 705, and the output 772 of the programmable output stage provides the "A" channel output of the chip. A data signal is provided to the first 18:1 multiplexer 720 on line 780 from the programmer 121, if this is the first chip, such as 202, in a probe head, or from the last latch (not shown) in the preceding chip if this is not the first chip in the probe head. The data feeds from multiplexer 720 via line 781 to the next multiplexer 721, then feeds to the next multiplexer in the "A" channel via line 782, then to the multiplexers in the "B" channel on line 783, thence to the "B" channel output stage 707 via line 786, and then to the "A" channel output stage via line 787. This IC chip is described more fully in U.S. patent application Ser. No. 1,094,751, which is incorporated herein by reference.

Figure 6:
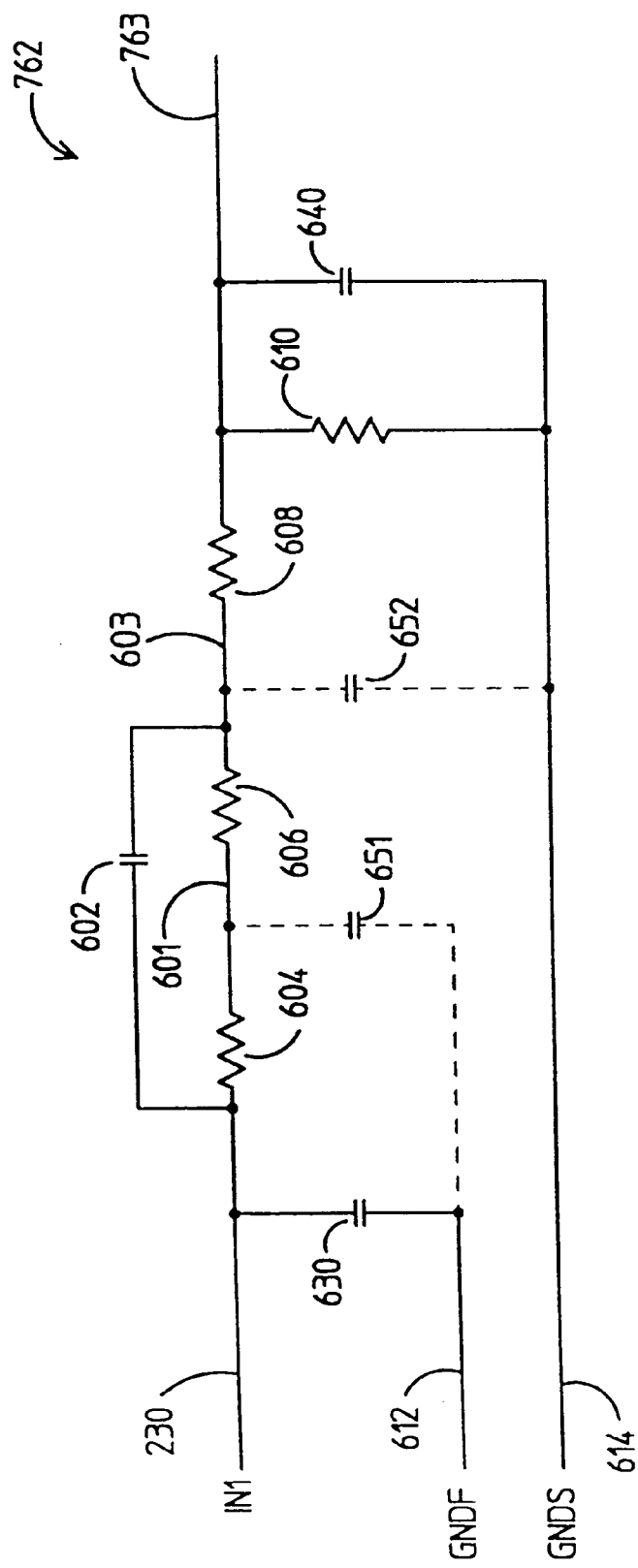
FIG. 6 shows a circuit diagram of the input circuit, including the input divider network, of the integrated circuit of FIG. 7.

FIG. 6 shows a detailed circuit diagram of the input divider 762. An important feature of this divider is that it is on the IC chip 202, which allows one to take advantage of IC geometries that allow large numbers of high impedance networks in small areas and still get low coupling. Input divider 762 includes input 230, GndF ground line 612, GndS ground line 614, compensation capacitor 602, and resistors 604, 606, 608, and 610. The GndS ground is the "sense" ground or conventional ground of the bonding pad on which the IC is located, and the GndF ground is a special current return ground to remove high frequency current from the pad. Other capacitances that are not actual devices within the divider network, but which must be considered so that the divider functions as desired, are shown in FIG. 6. These include the pad capacitance 630, which is the net output capacitance of the bonding pad on which the chip is located, amp capacitance 640, which is the input capacitance of the muxamp to which the output 763 of the input divider 202 connects, stray capacitance 651 which is the stray capacitance between the input 230 and the GNDF ground 612, and stray capacitance 652, which is the stray capacitance between the input 230 and the GndS ground 614. The lines to the latter two capacitances are dotted to indicate that these are parasitic capacitances.

The input voltage divider network comprises resistors 604, 606, and 608 in series between the input 230 and the output 763 of the input divider 762, plus resistor 610 connected between output 763 and GndS ground 614. Capacitor 602 is connected in parallel with resistors 604 and 606 between the input 230 and the node 603. This capacitor compensates for the stray capacitances 651 and 652 and the amp capacitance 640. The pad capacitance occurs between the input 230 and the GndF ground 612, the stray capacitance 651 is indicated between the node 601 and the GndF ground 612, and the stray capacitance 652 is indicated between the node 603 and the GndS ground 614. The amp capacitance occurs between the output 763 and the GndS ground.

Preferably, capacitance 602 is 70 femtofarads, and resistors 604, 606, 608 and 610 are 7.6 Kohms, 3.8 Kohms, 7.6 Kohms, and 1 Kohm, respectively. In the preferred embodiment, pad capacitance 630 is 125 femtofarads, stray capacitance 651 is 20 femtofarads, stray capacitance 652 is 10 femtofarads, and amp capacitance 640 is 120 femtofarads.

The total input impedance of input divider circuit 762 is the sum of the four resistors 604, 606, 608, and 610 which totals 20 Kohms. A high input impedance is important in an analog probe, since it prevents the probe circuit from interacting with the circuit under test. However, making the input divider ratio too high, to attain higher input impedance, will attenuate the input signal to the point that the signal is too small to maintain good signal integrity. Moreover, when so many inputs are in such a small area, i.e. when the input is very dense, it is difficult to provide high input impedance with low coupling between the channels. It is an important feature of the invention that it combines a high input impedance for each of more than a hundred inputs with high signal integrity.

There has been described a novel analog signal test probe which provides the capability of selection of hundreds of probe channels and at the same time provides high signal integrity and band width, which can be easily and inexpensively customized for use with a particular circuit under test, and which has many other advantages. It is evident that, now that the invention has been fully disclosed, those skilled in the art may now make numerous uses and modifications of the specific embodiment described, without departing from the inventive concepts. For example, now that it is seen that a ground personality board with fusible connections to ground provides ease of customization of a probe to a particular circuit under test, others can now utilize the teachings to design and manufacture many different varieties of analog probes. Or equivalent components or circuits can be substituted for the various components and circuits described. Additional features may be added. A greater or lesser number of parts may be used. Consequently, the invention is to be construed as embracing each and every novel feature and novel combination of features present in and/or possessed by the test probe described.

What is claimed is:

1. A method of making an analog voltage probe, said method comprising:

providing a probe circuit comprising: an analog amplifier; a plurality of terminals each adapted to be connected to one of the pins of a circuit under test; a plurality of probe input leads, each of said leads connected to one of said terminals and connectable to said analog amplifier; a probe ground; and a fusible element connecting each of said probe input leads to said probe ground; and fusing selected ones of said fusible elements corresponding to the active pins of said circuit under test.

2. A method as in claim 1 wherein said step of fusing comprises connecting said probe circuit to a simulated circuit under test having a plurality of pins, and applying a voltage to selected ones of said pins.

3. A method as in claim 1 wherein said step of fusing comprises:

connecting said probe circuit to a device having a plurality of pins corresponding to the pins of said device under test, each pin electrically connected to one of said terminals;

placing an insulating cap on the ones of said pins that are designated as grounds in said circuit under test; and applying a voltage to the remainder said pins.

4. A method as in claim 3 wherein said voltage is between 3 volts and 5 volts.

* * * * *